(12) United States Patent
Ellis et al.

(10) Patent No.: US 6,912,665 B2
(45) Date of Patent: Jun. 28, 2005

(54) AUTOMATIC TIMING ANALYZER

(75) Inventors: Wayne F. Ellis, Jericho, VT (US); John A. Fifield, Underhill, VT (US); Louis Hsu, Fishkill, NY (US); William V. Huott, Holmes, NY (US)

(73) Assignee: International Business Machines Corporation, Armonk, NY (US)

( * ) Notice: Subject to any disclaimer, the term of this patent is extended or adjusted under 35 U.S.C. 154(b) by 677 days.

(21) Appl. No.: 09/827,026

(22) Filed: Apr. 5, 2001

(65) Prior Publication Data

US 2002/0194539 A1 Dec. 19, 2002

(51) Int. Cl.[7] ............................................... G06F 1/04
(52) U.S. Cl. ..................... 713/401; 713/503; 714/30
(58) Field of Search ............................... 713/400–600; 716/4, 6; 714/25, 30, 33, 37

(56) References Cited

U.S. PATENT DOCUMENTS

| 5,396,170 | A | * | 3/1995 | D'Souza et al. | ......... 324/158.1 |
| 5,589,788 | A | * | 12/1996 | Goto | ........................... 327/276 |
| 6,161,420 | A | * | 12/2000 | Dilger et al. | .............. 73/24.01 |
| 6,407,641 | B1 | * | 6/2002 | Williams et al. | ............ 331/1 A |
| 6,714,021 | B2 | * | 3/2004 | Williams | ..................... 324/533 |

* cited by examiner

Primary Examiner—Dennis M. Butler
(74) Attorney, Agent, or Firm—Whitham, Curtis & Christofferson, P.C.; Robert A. Walsh

(57) ABSTRACT

A test methodology is used to conduct an automatic chip timing analysis in coarse and fine resolution steps. Timing adjustment circuits implement coarse timing adjustment and fine timing adjustment for chip timing analysis. Timings such as clock, address and control inputs to a memory system can be digitally adjusted with respect to each other. A timer circuit is provided with a counter so that an incremental or decremental timing analysis can be carried out with a specific timing step. An algorithm is implemented which provides an effective, low-cost and accurate timing analysis. A nested loop is set up in the BIST where all possibilities of timing relationships between two or more signals can be applied to a device under test, and weaknesses, or failing timing conditions, can be found.

15 Claims, 8 Drawing Sheets

AUTOMATIC TIMING ANALYZER

BACKGROUND OF THE INVENTION

1. Field of the Invention

The present invention generally relates to testing electronic circuits and, more particularly, to an automatic test method and system for testing integrated circuit (IC) memory chips, such as dynamic random access memory (DRAM) circuits.

2. Background Description

Usually a bench tester is used to test the access time of a memory chip manually. The procedure is first to pick a reasonable access time to test the memory array at a certain temperature. If the array functions properly, then the array will be tested again with an access time shorter than the originally set time. However, if the array fails, the time is extended. The method is repeated until the array functions properly at the minimum access time, but fails if the time further is shortened by some time interval. The resolution of the time interval is usually determined by the capability of the bench tester. Although the bench tester can be programmed to perform access time analysis, this method is time consuming and of limited accuracy.

Built In Self Test (BIST) can perform on-chip testing of integrated circuits by application of various patterns and voltages utilizing a limited number of timing sets. Variation in the relative timings between address, control and clock signals has been restricted to a few basic patterns. More exhaustive timing tests between input signals can only be done by "schmoo testing" on an external tester, a test sequence which performs testing while varying several parameters. Hence a facet of conventional testing is not possible using existing BIST. Traditional schmoo testing can be performed by sequentially adjusting the timing of a first signal while holding others constant, then incrementing the timing of a second signal and repeating the timing variation of the first signal. Traditional schmoo testing is an important tool to look for unintentional interactions between input timing and stimuli to a macro or logic block. For example, if a memory array is receiving an input signal while its sense amplifiers are setting, wiring resistance can create a ground bounce and cause an input signal to be misread, or delayed. Another classical power rail problem is caused by the simultaneous firing of off-chip drivers (OCDs) while attempting to input a signal for a next operation. A macro may function properly when inputs are received just prior to, and just after, the firing of the OCDs but may have a timing sensitivity and fail a subsequent operation due to a sensitivity to a specific relationship between input stimuli.

U.S. Pat. No. 5,961,653 to Kalter Ct al. discloses a microprocessor based BIST for an embedded memory; however, the complication and density impact of including a microprocessor on an on-chip macro makes this approach inefficient and impractical.

SUMMARY OF THE INVENTION

It is therefore an object of the present invention to provide a test methodology to conduct an automatic chip timing analysis in coarse and fine resolution steps.

It is another object of the invention to provide timing adjustment circuits which implement coarse timing adjustment and fine timing adjustment for chip timing analysis.

It is a further object of the invention to provide a system and method in which timings such as clock, address and control inputs to a memory system can be digitally adjusted with respect to each other.

According to the invention, a timer circuit is provided with a counter so that an incremental or decremental timing analysis can be carried out with a specific timing step. An algorithm is implemented which provides an effective, low-cost and accurate timing analysis. A nested loop is set up in the BIST where all possibilities of timing relationships between two or more signals can be applied to a device under test, and weaknesses, or failing timing conditions, can be found.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
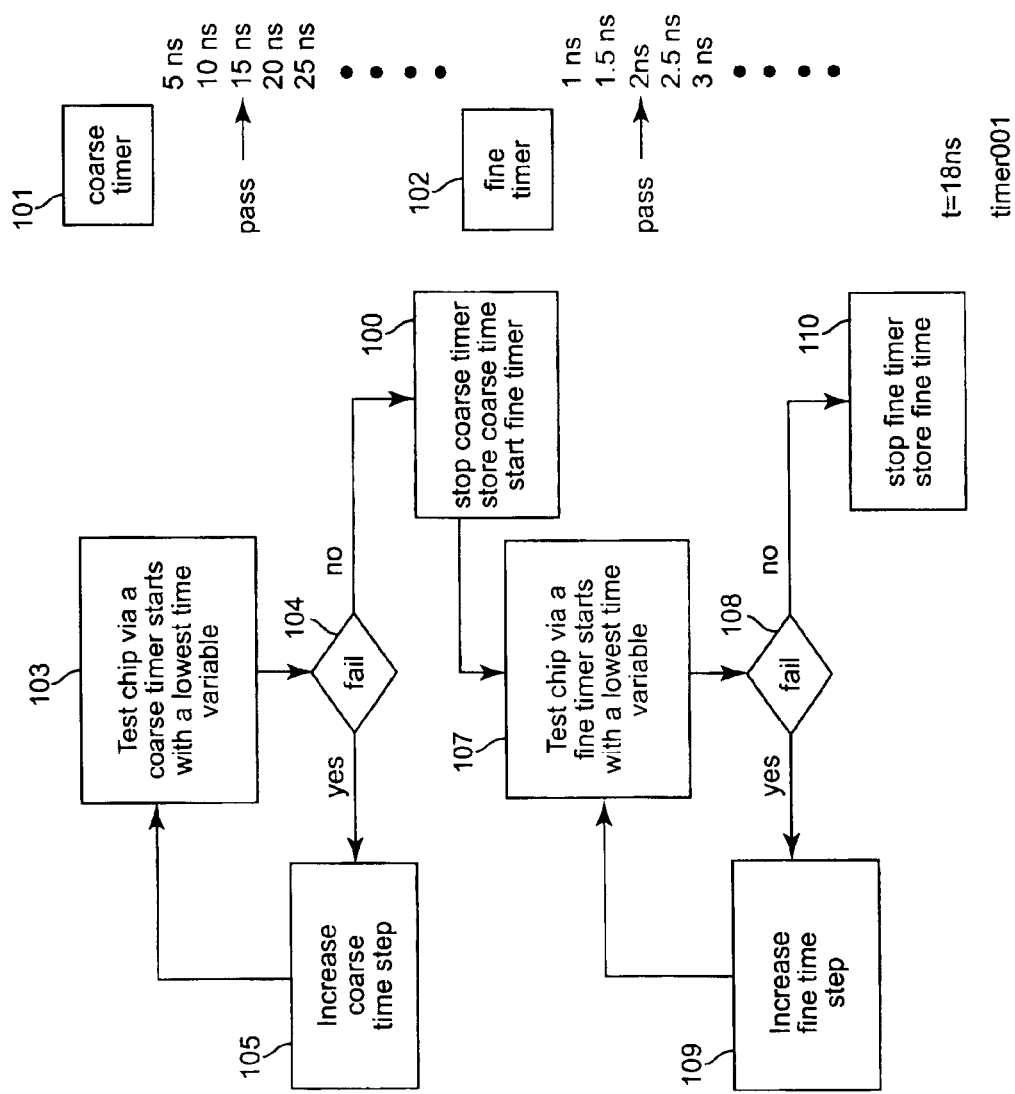
FIG. 1 is a flow diagram illustrating the logic of the algorithm implemented by the invention.

Referring now to the drawings, and more particularly to FIG. 1, there is shown a Built-In Self-Test (BIST) algorithm for auto-analysis of the access time. In this embodiment, there are two timers, a coarse timer 101 and a fine timer 102. The process begins by testing the chip in function block 103 via the coarse timer set to a lowest time variable. A determination is made in decision block 104 as to whether the chip passed the test and, if not, the coarse timer time step is increased in function block 105. If the chip passes the coarse timer test, then the coarse timer is stopped (latched) and the fine timer is started in function block 106. The chip is then tested in function block 107 via the fine timer, which also starts at the lowest time variable. A determination is made in decision block 108 as to whether the chip passed the test and, if not, the fine timer time step is increased in function block 109. When the chip passes the fine timer test, then the fine timer is stopped (latched) in function block 110.

This process is accomplished by integrating at least two timer circuits into one chip to perform the algorithmic access time measurement. The first timer provides coarse timing adjustment, while the second timer provides fine timing adjustment. Extension of this concept to provide more timers with finer resolutions can be readily adapted without changing the concept of the invention. For simplicity, only two timers are illustrated. A chip is tested starting from a slower limit and the access time strobe setting is decreased by using the coarse timing adjustment. For example, if the array is expected to have an access time at about 15 nanoseconds (ns) to 20 ns, 10 ns is picked to start the first run of testing. If the chip fails, the timer is incremented by one index of 5 ns each time until the chip passes. If the chip fails at 15 ns but passes at 20 ns, at this moment the final fail state of the coarse timer is latched. In this case, 15 ns timing index is stored in the tester. The chip is now tested using the fine timer starting at 1 ns intervals each time of testing until the chip reaches its first pass. At this point, the access time of the chip including the timing index of the coarse and fine timer are recorded in the tester. As shown in FIG. 1, in this example, an access time is the summation of 15 ns (index recorded from the coarse timer) plus 2 ns (index recorded from the fine timer) or 17 ns, when the chip first passes the test. The timer settings are stored in a register and finally read out to show the final access time of the chip at a certain testing temperature.

Based on the same concept, many other similar algorithms can be carried out to conduct such an automatic timing test. Instead of incrementing the timing index, one can start with a pass state and then decrement the index until the chip fails. Or one can program the tester to perform the test by incrementing the coarse timer, while the fine timer is decremented, or vice versa. One can also start testing from any arbitrary starting point, especially during fine time testing by either incrementing or decrementing, depending on the pass or fail result of the testing.

Figure 2:
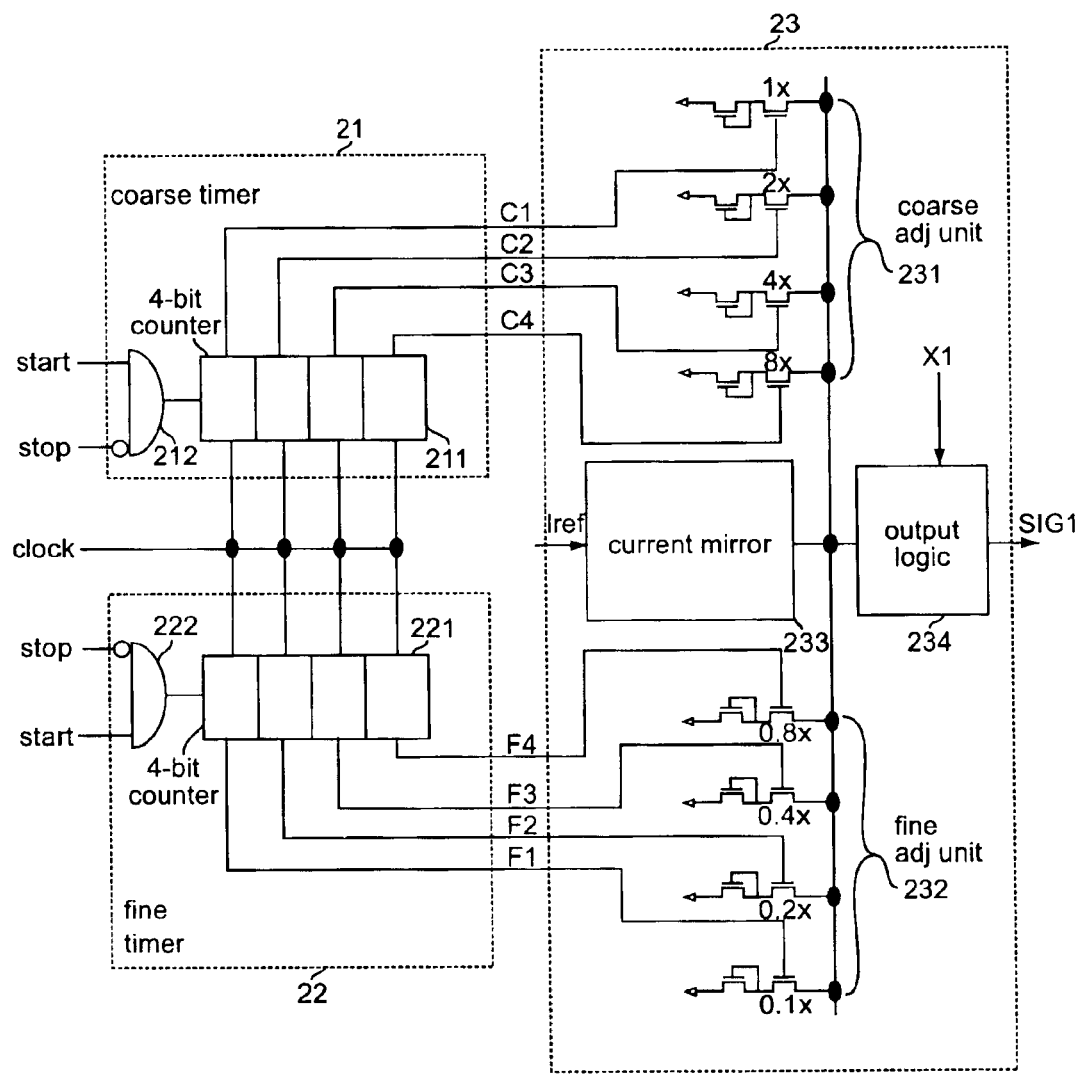
FIG. 2 is a block and logic diagram of the coarse and fine timer hardware of the invention.

An example of a timer circuit is shown in FIG. 2. The coarse timer 21 uses a 4-bit counter 211 to generate sixteen intervals C1, C2, C3, and C4. Likewise, the fine timer 22 uses a 4-bit counter 221 to generate sixteen intervals F1, F2, F3, and F4. Alternatively, counters of other capacity can be used, such as 3-bit counters or 5-bit counters, if the interval needs to be reduced or increased. The coarse timer 21 is controlled by a start and stop signals input to AND gate 212. The counter starts to count only when the BIST sends out START and NOT STOP signals. Each clock period is a single test also issued by the BIST circuit. Similarly, the fine timer 22 is controlled by start and stop signals input to AND gate 222.

As shown in the table below, each 4-bit counter will decrement the timing by n times the interval. The interval is set by size of the timing adjustment unit.

| Coarse | | | | | Fine | | | | |
|---|---|---|---|---|---|---|---|---|---|
| 1× | 2× | 4× | 8× | | .1× | .2× | .4× | .8× | |
| 0 | 0 | 0 | 0 | 0× | 0 | 0 | 0 | 0 | .00× |
| 1 | 0 | 0 | 0 | 1× | 1 | 0 | 0 | 0 | .01× |
| 0 | 1 | 0 | 0 | 2× | 0 | 1 | 0 | 0 | .02× |
| 1 | 1 | 0 | 0 | 3× | 1 | 1 | 0 | 0 | .03× |
| 0 | 0 | 1 | 0 | 4× | 0 | 0 | 1 | 0 | .04× |
| 1 | 0 | 1 | 0 | 5× | 1 | 0 | 1 | 0 | .05× |
| 0 | 1 | 1 | 0 | 6× | 0 | 1 | 1 | 0 | .06× |
| 1 | 1 | 1 | 0 | 7× | 1 | 1 | 1 | 0 | .07× |
| 0 | 0 | 0 | 1 | 8× | 0 | 0 | 0 | 1 | .08× |
| 1 | 0 | 0 | 1 | 9× | 1 | 0 | 0 | 1 | .09× |
| 0 | 1 | 0 | 1 | 10× | 0 | 1 | 0 | 1 | .10× |
| 1 | 1 | 0 | 1 | 11× | 1 | 1 | 0 | 1 | .11× |
| 0 | 0 | 1 | 1 | 12× | 0 | 0 | 1 | 1 | .12× |
| 1 | 0 | 1 | 1 | 13× | 1 | 0 | 1 | 1 | .13× |
| 0 | 1 | 1 | 1 | 14× | 0 | 1 | 1 | 1 | .14× |
| 1 | 1 | 1 | 1 | 15× | 1 | 1 | 1 | 1 | .15× |

1× = 5 ns
0.1× = 0.5 ns

C1, C2, C3, C4 are output digits from the coarse timer 21 (shown in FIG. 2) to the timing adjustment unit 23. For example, when C1=1, C2=1, C3=0 and C4=0, then a timing of 3× of the unit delay time is produced at output SIG1 of the timing adjustment unit 23. The unit delay time of the coarse timer 21 is in the range of 5 ns; therefore, the fine timer 22 is needed for increased resolution. According to the flow chart shown in FIG. 1, when the coarse timer 101 is stopped (latched), the fine timer 102 is activated, and counting is triggered by the clock. For each test, if the result is negative, the clock will trigger the fine timer 102 to decrease the fine time by an interval. The interval of the fine timer is in the range of 0.5 ns.

The coarse time adjustment unit 231 of timing adjustment unit 23 uses current loading to adjust the time delay. The fine time adjustment unit 232 is built similar to that of the coarse time adjustment unit, except the device sizes are smaller. A current mirror 233 receives a reference signal input, Iref, to supply an output which is subjected to switched loading by the coarse adjustment unit 231 and the fine adjustment unit 232. Output logic 234 supplied with the current loading to adjust the time delay. This is basically a summation operation. The final timing adjustment is the sum of coarse adjustment plus fine adjustment. In this example, the first pass on the fine time testing will stop the testing. If another even finer timer is included, the same operation will continue to get more accurate access time reading.

Such test methodology can apply to almost any kind of circuit timing analysis. Some examples include the estimation of a clock frequency of a microprocessor chip, memory array access timing, cycle time, etc.

Figure 3:
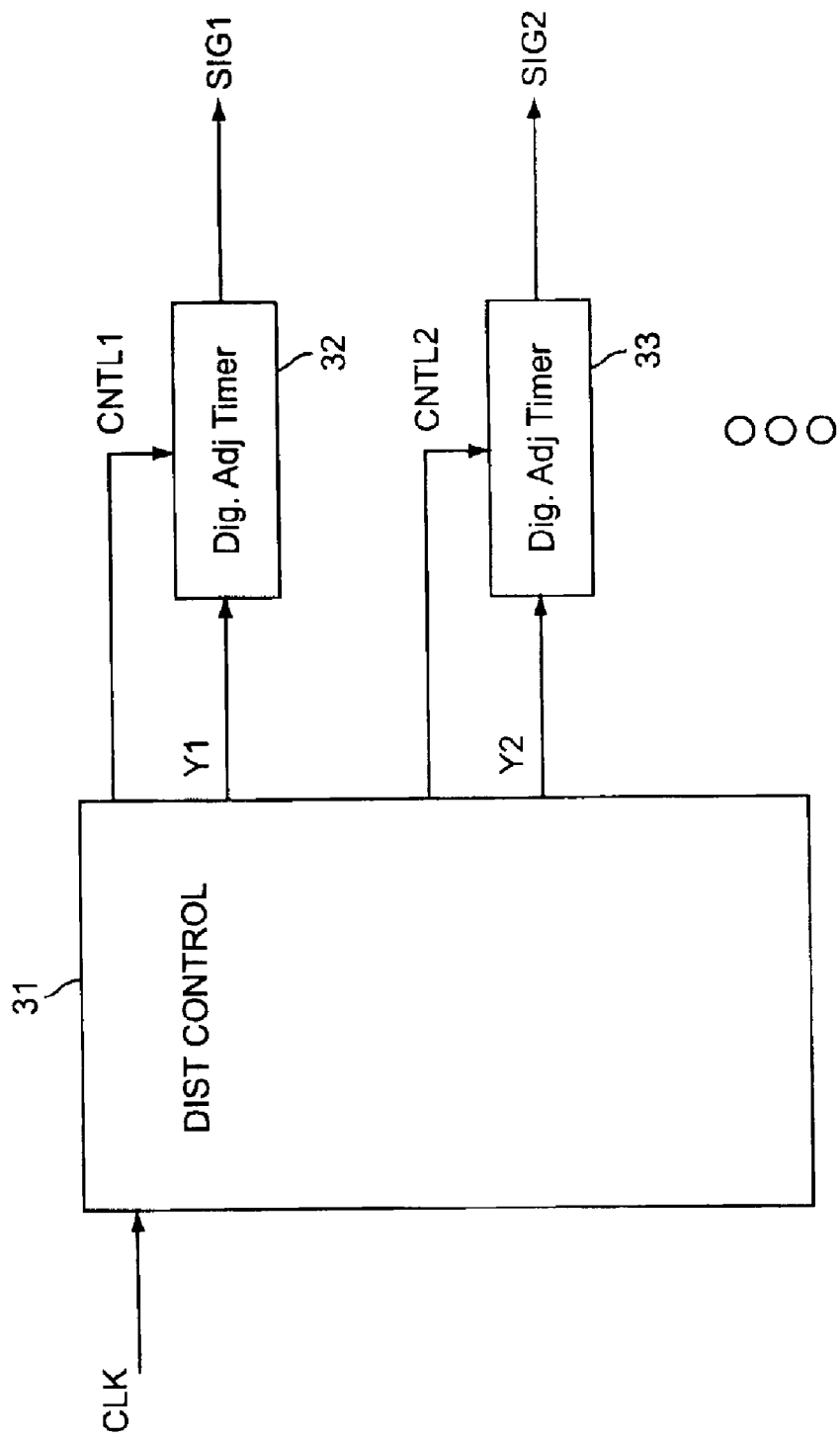
FIG. 3 is a block diagram of banks of counters used to schmoo two variables.

FIG. 3 shows a BIST system where timing variations between signals can be automatically adjusted in the course of BIST operation to perform schmoo testing. The BIST control block 31 is shown connected to digitally adjustable timers 32 and 33. Note that more timers could be used as generally indicated in FIG. 3. Timing signals X1 and X2 are output by the BIST control block 31 and are input to the adjustable timers 32 and 33. Control words CNTL1 and CNTL2 are digital words which can be incremented or decremented to adjust timings of SIG1 and SIG2. Third inputs to the timers (not shown in FIG. 3) are reference signals, Iref1 and Iref2, which serve as range adjustments to the digital timers.

Figure 4:
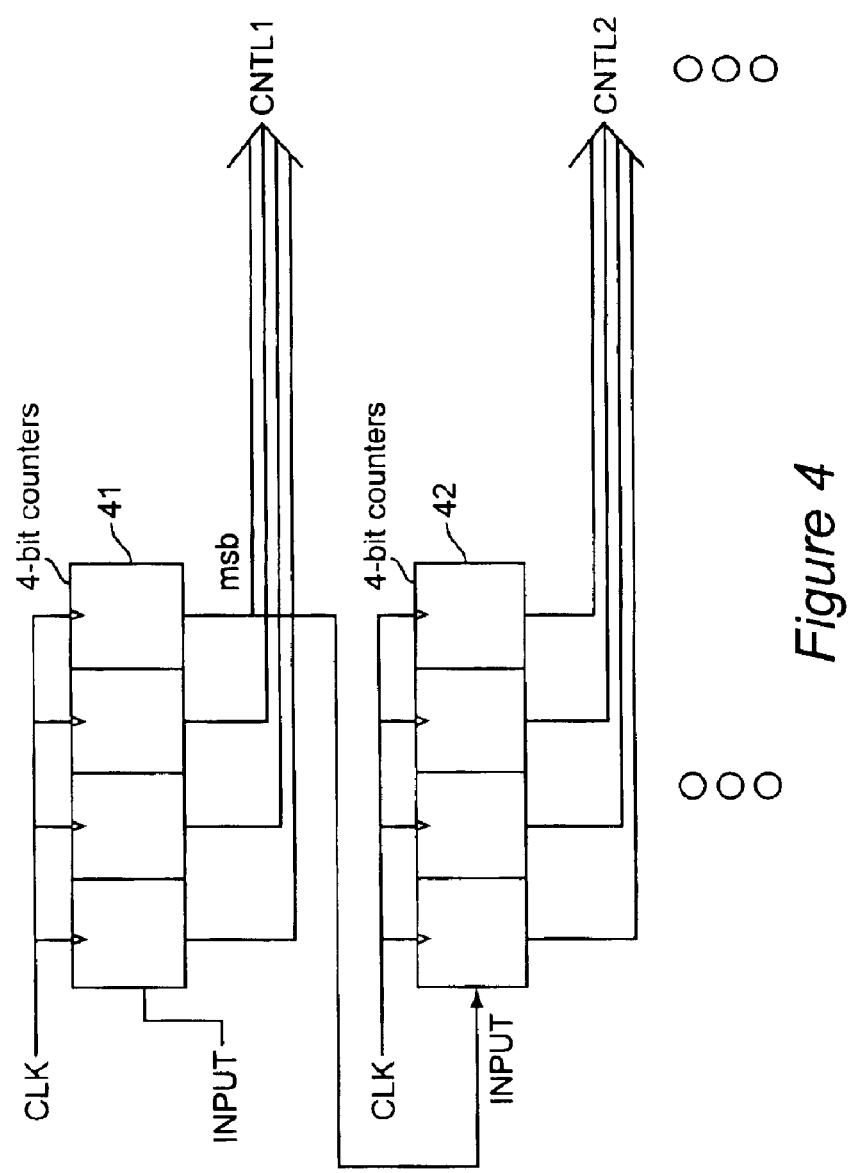
FIG. 4 is a block diagram of two banks of counters used to schmoo two variables.

FIG. 4 shows a pair of 4-bit counters controlled by clock signal CLK to generate the control words CNTL1 and CNTL2. As CLK is pulsed, the 4-bit outputs CNTL1 and CNTL2 are progressed through their count. CNTL1 steps through 16 timing adjustments before CNTL2 increments (or decrements) to its next level. A loop has been set up which will step through all possible timing relationships between SIG1 and SIG2. More timers can be added for SIG3, etc., to do n-dimensional schmoo testing. Timing ranges can be adjusted by setting the reference signals, Iref1 and Iref2 (not shown in FIG. 3), to a desired level.

Figure 5:
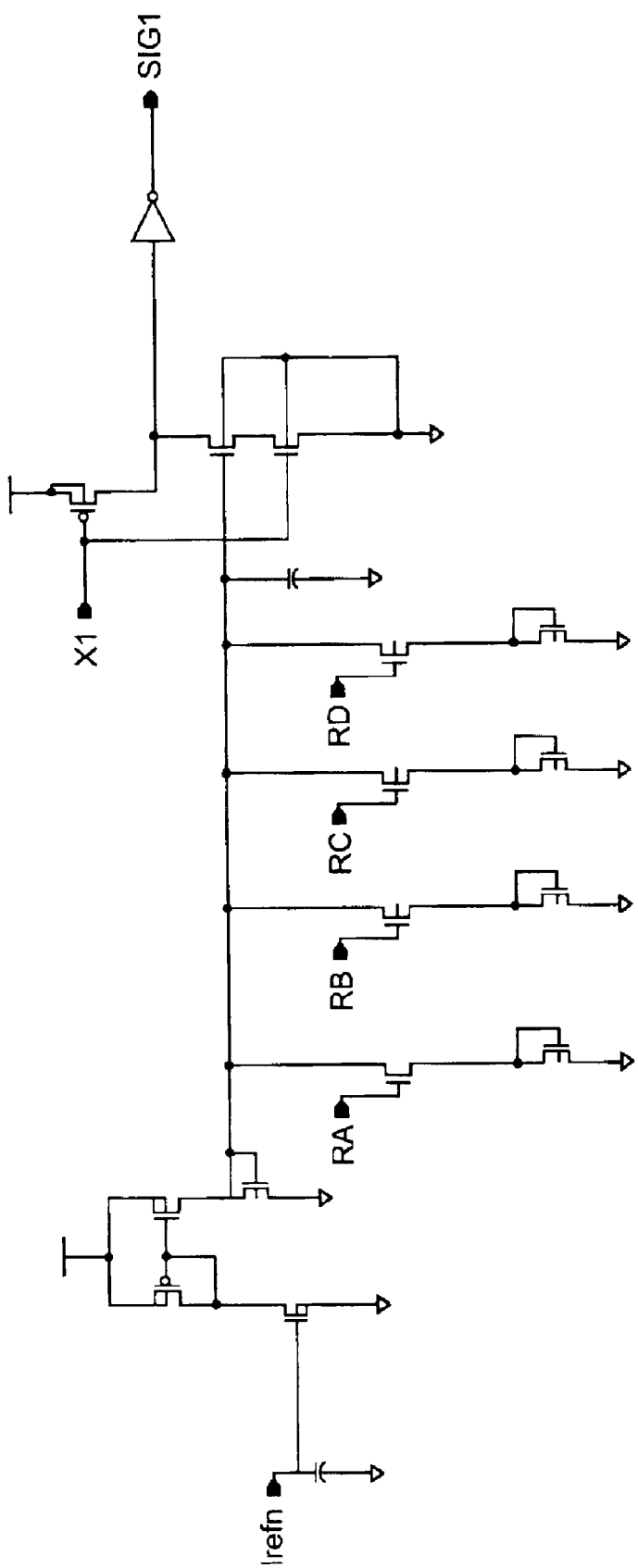
FIG. 5 is a schematic diagram of a digitally adjustable timer.

FIG. 5 shows the digitally adjusted timer. Transistors T20 to T23 mirror the reference current, Irefn, for isolation, and digital delay adjustment is made by selection of control word RA, RB, RC, and RD which modulate gates T24 to T31 to set the Vbiased current level. Output gates can be made of inverters or other logic gates to combine functions and minimize insertion delay by replacing existing gates in a logic block. Input signal Xn is delayed as current source T32 is varied. Delay of Xn is precisely set by the current through current source T32 and by the capacitance of the node capacitor.

Figure 6:
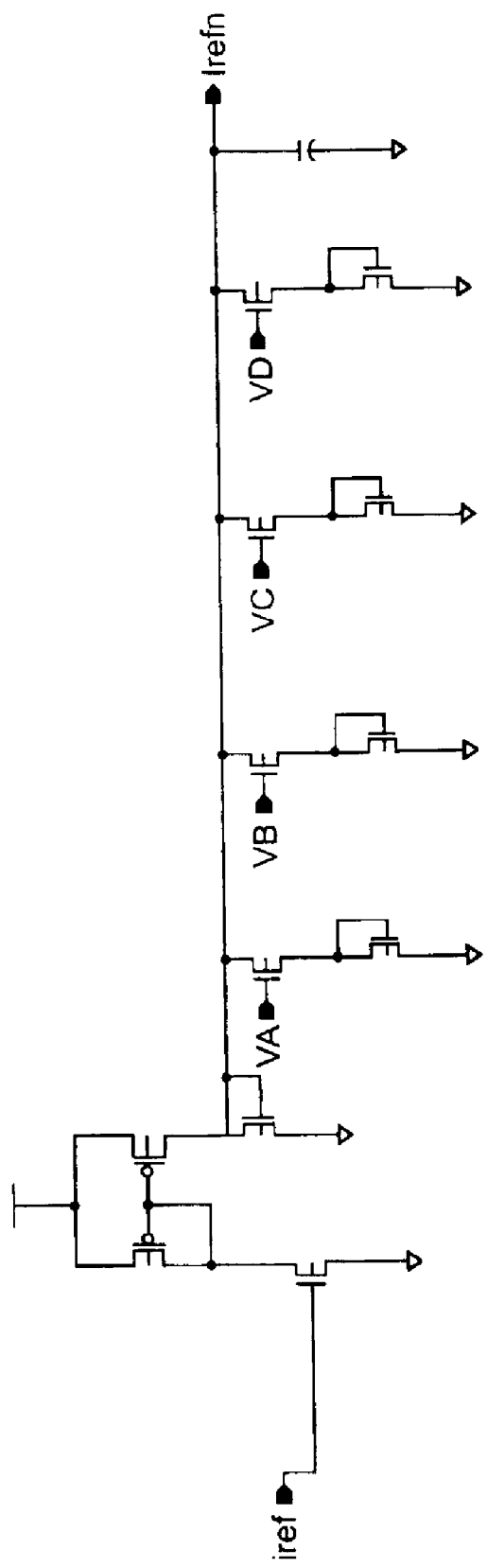
FIG. 6 is a schematic diagram of a circuit for performing a digital adjustment of the analog level Irefn.

FIG. 6 shows how the reference current, Irefn, is generated from a current reference such as a band gap source or from an off-chip power source. Transistors T1 to T4 mirror the current source Iref to node Irefn to provide isolation. Diodes and switches implemented by transistors T5 to T12 are used to set the Irefn level using current mirror techniques. Control inputs VA, VB, VC, and VD make a digital control word which modulates the Iref level for range control of the digital timers. Input Iref can be trimmed or chosen to scale the timing ranges as appropriate to a particular macro's timing test requirements.

Figure 7A:
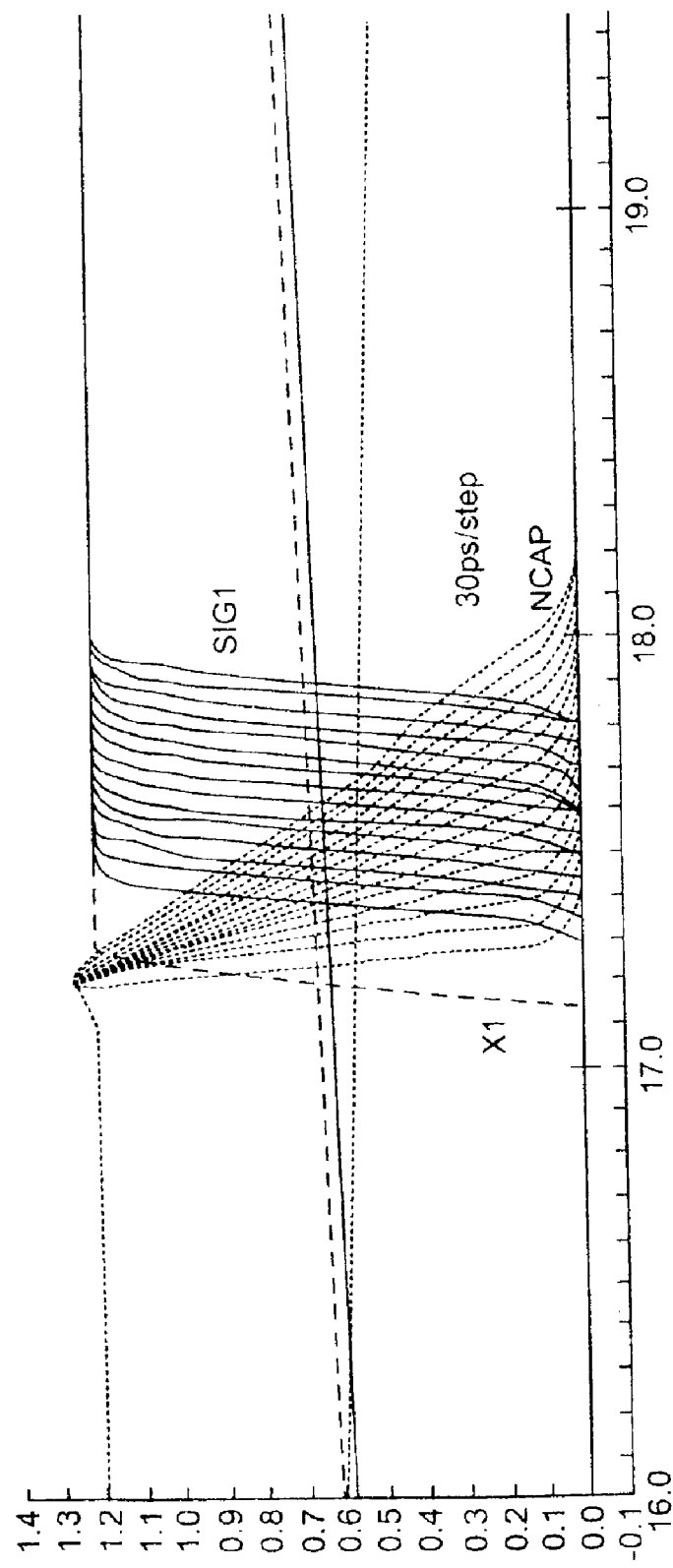
FIGS. 7A and 7B are graphs showing the effects of the digital adjustment of the signal.
Figure 7B:
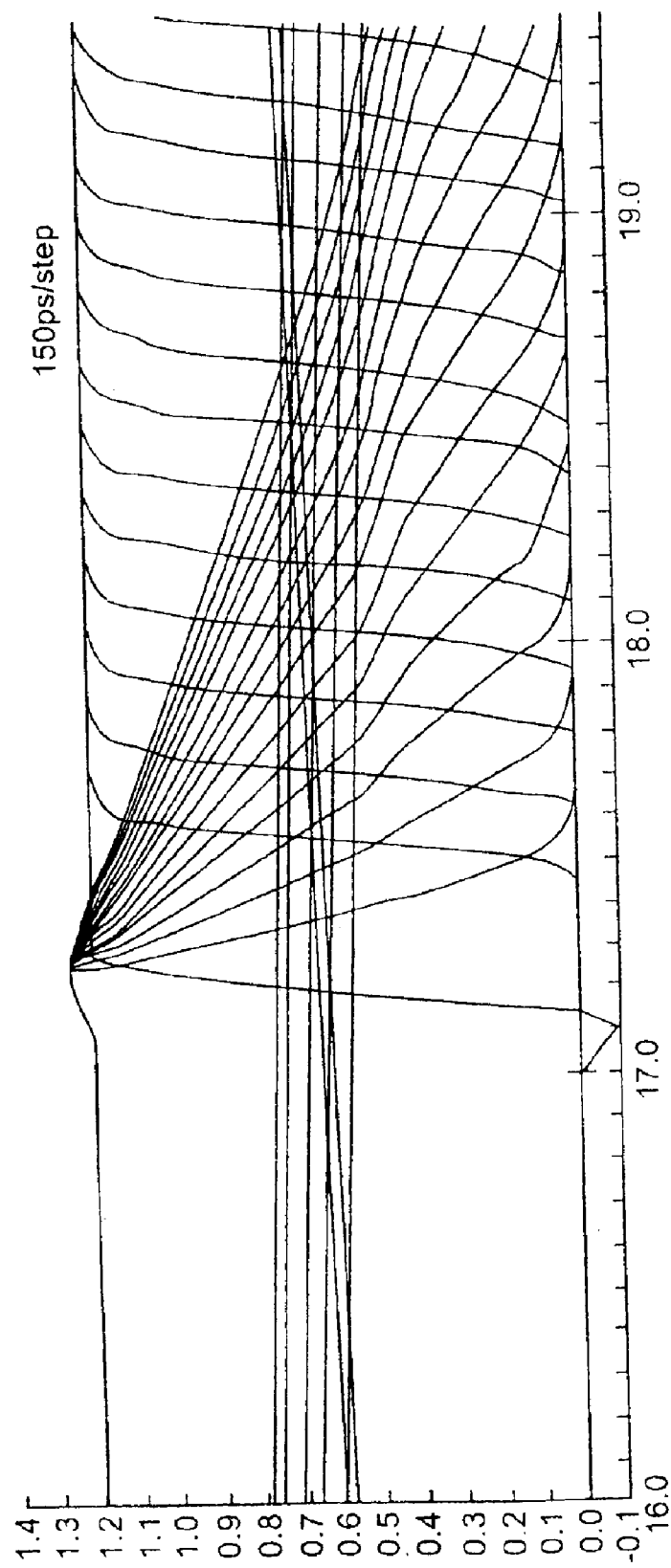

FIGS. 7A and 7B show HSPICE analysis on a range of timing adjustments possible with the above circuit technique and demonstrate the linearity with which this timing element works. Using these circuits, sixteen bit adjustments can be made on one signal. Exhaustive timing cases can easily be constructed by looping through N*signals*16 bits per signal. Coarser or finer range adjustments can be made by varying the width of control words Vn and Rn to desired length.

While the invention has been described in terms of preferred embodiments, those skilled in the art will recognize that the invention can be practiced with modification within the spirit and scope of the appended claims.

What is claimed is:

1. An automatic timing analyzer for determining a propagation delay time of an electronic circuit comprising:
   a first timer for performing a coarse measurement of propagation delay time;
   a second timer for performing a fine measurement of of propagation delay time; and
   storage means for storing timing measurements of the first and second timers.

2. The automatic timing analyzer recited in claim 1, wherein the electronic circuits are integrated circuits and the timing analyzer is a component of a Built In Self Test (BIST) system on an integrated circuit.

3. The automatic timing analyzer recited in claim 2, wherein the BIST system includes separately controlled delay elements for controlling timing of output signals for said first and second timers.

4. The automatic timing analyzer recited in claim 3, wherein the delay elements are controlled by individual control words.

5. The automatic timing analyzer recited in claim 4, wherein the control words are generated from a bank of binary counters.

6. The automatic timing analyzer recited in claim 5, wherein relative timing of output signals is adjusted by incrementing or decrementing respective counters in the bank of binary counters.

7. The automatic timing analyzer recited in claim 5, wherein a set of control words are stepped through by the bank of binary counters.

8. An integrated circuit having a Built In Self Test (BIST) system which includes a first timer for performing a coarse propagation delay time measurement of the integrated circuit, a second timer for performing a fine propagation delay time measurement of the integrated circuit, and storage means for storing measurements of the first and second timers.

9. The integrated circuit recited in claim 8, wherein the BIST system is used to test effects of timing skews between multiple stimuli.

10. The integrated circuit recited in claim 9, wherein all possible combinations of a plurality of timing signals and a plurality of timing variations are tested.

11. A method of testing electronic circuits comprising the steps of:
    performing a coarse propagation delay time measurement of an electronic circuit;
    performing a fine propagation delay time measurement of the electronic circuit; and
    storing the coarse and fine timing measurements.

12. The method of testing recited in claim 11, further comprising the step of controlling timing signals for said coarse and fine timing measurements.

13. The method of testing recited in claim 12, wherein the step of controlling is performed using individual control words.

14. The method of testing recited in claim 13, further comprising the step of generating the individual control words with a bank of binary counters.

15. The method of testing recited in claim 14, further comprising the step of incrementing or decrementing respective counters in the bank of binary counters to adjust relative timing for said coarse and fine testing measurements.

* * * * *